(12) United States Patent
Lin

(10) Patent No.: US 8,044,856 B1
(45) Date of Patent: Oct. 25, 2011

(54) DUAL LO RECEIVER

(75) Inventor: Qiang Lin, Fountain Valley, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 176 days.

(21) Appl. No.: 12/356,757

(22) Filed: Jan. 21, 2009

(51) Int. Cl.
*G01S 19/35* (2010.01)

(52) U.S. Cl. .................................. 342/357.75

(58) Field of Classification Search ............ 342/357.06, 342/357.75
See application file for complete search history.

(56) References Cited

U.S. PATENT DOCUMENTS

| | | | |
|---|---|---|---|
| 6,865,276 B1 * | 3/2005 | Ljungberg et al. ........... 381/94.1 |
| 7,047,023 B1 * | 5/2006 | Tso .............................. 455/456.6 |
| 7,356,388 B2 * | 4/2008 | Waugh et al. ..................... 701/1 |
| 2001/0044280 A1 * | 11/2001 | Samuels .......................... 455/77 |
| 2002/0054627 A1 * | 5/2002 | Asikainen ..................... 375/219 |
| 2008/0094108 A1 * | 4/2008 | Leon .............................. 327/99 |
| 2008/0204288 A1 * | 8/2008 | Anderson et al. ............. 341/106 |
| 2010/0040184 A1 * | 2/2010 | Haralabidis et al. .......... 375/373 |

* cited by examiner

*Primary Examiner* — Thomas H. Tarcza
*Assistant Examiner* — Harry Liu
(74) *Attorney, Agent, or Firm* — Bay Area Technology Law Group PC

(57) ABSTRACT

A selectable frequency source for use in GPS receivers. A device in accordance with one or more embodiments of the present invention comprises at least one reference frequency source, a circuit, coupled to the at least one reference frequency source, and a mixer, coupled to an output of the circuit, for mixing a GPS signal with the output of the circuit, wherein a frequency output of the mixer is changed based on an input to the circuit.

14 Claims, 10 Drawing Sheets

DUAL LO RECEIVER

CROSS-REFERENCE TO RELATED APPLICATIONS

This application is related to U.S. patent application Ser. No. 11/409,799, filed on Apr. 24, 2006, entitled "METHOD AND APPARATUS FOR ADAPTING A RECEIVER FREQUENCY PLAN ACCORDING TO LOCATION," by Qiang Lin, which application is incorporated by reference herein.

BACKGROUND OF THE INVENTION

1. Field of the Invention

The present invention relates generally to Global Positioning System (GPS) receivers, and in particular, to a method and apparatus for adapting a frequency plan based on location of the GPS receiver.

2. Description of the Related Art

The use of GPS in consumer products has become commonplace. Hand-held devices used for mountaineering, automobile navigation systems, and GPS for use with cellular telephones are just a few examples of consumer products using GPS technology.

GPS-enabled devices, such as cellular telephones, have also been introduced into the consumer marketplace. These devices allow for the use of Location-Based Services (LBS) which are services, advertisements, and other features that are offered based on the location of the user. As such, GPS-enabled devices are used worldwide.

The use of the frequency spectrum in the United States, and in other countries, is typically very tightly controlled by the government. However, the frequency allotments for telephone use, radio navigation, etc. are allocated differently, and thus, devices that operate in their own frequency band in one country may have to share that frequency band with other devices in other countries. As such, when a GPS-enabled device is brought from one country to another, the operability of such a device may be less than desirable.

It can be seen, then, that there is a need in the art to make GPS-enabled devices operable in countries with various frequency spectrum allocations.

SUMMARY OF THE INVENTION

To minimize the limitations in the prior art, and to minimize other limitations that will become apparent upon reading and understanding the present specification, the present invention describes a selectable frequency source for use in GPS receivers.

A device in accordance with one or more embodiments of the present invention comprises at least one reference frequency source, a circuit, coupled to the at least one reference frequency source, and a mixer, coupled to an output of the circuit, for mixing a GPS signal with the output of the circuit, wherein a frequency output of the mixer is changed based on an input to the circuit.

Such a device further optionally comprises the circuit being coupled to a single reference frequency source, the frequency output of the circuit being changed when the GPS receiver determines that the GPS receiver is in a predetermined geographic region, the predetermined geographic region being determined by a presence of an interfering signal, the interfering signal being a PDC signal, and the frequency output of the circuit being manually changed.

A selectable frequency source for use in a Global Positioning System (GPS) receiver in accordance with one or more embodiments of the present invention comprises a reference frequency source generating a reference frequency, a circuit, coupled to the reference frequency source, the circuit having an output frequency based on the reference frequency, and a mixer, coupled to the circuit, for mixing a GPS signal with the output frequency of the circuit, wherein the output frequency of the circuit is changed to change a frequency output of the mixer.

Such a device further optionally the output frequency being changed by changing an input signal to the circuit, the output frequency being changed when the GPS receiver determines that the GPS receiver is in a predetermined geographic region, the predetermined geographic region being determined by a presence of an interfering signal, and the interfering signal being a PDC signal.

A method in accordance with one or more embodiments of the present invention changes a local oscillator frequency in a Global Positioning System (GPS) receiver, and comprises determining the presence of a signal outside of a GPS spectra, and setting the local oscillator frequency to a predetermined frequency based on the presence of the signal outside of the GPS spectra.

Such a method further optionally comprises the signal outside of the GPS spectra being a PDC signal, and/or the signal outside of the GPS spectra being a GSM signal.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

OVERVIEW

Figure 1:
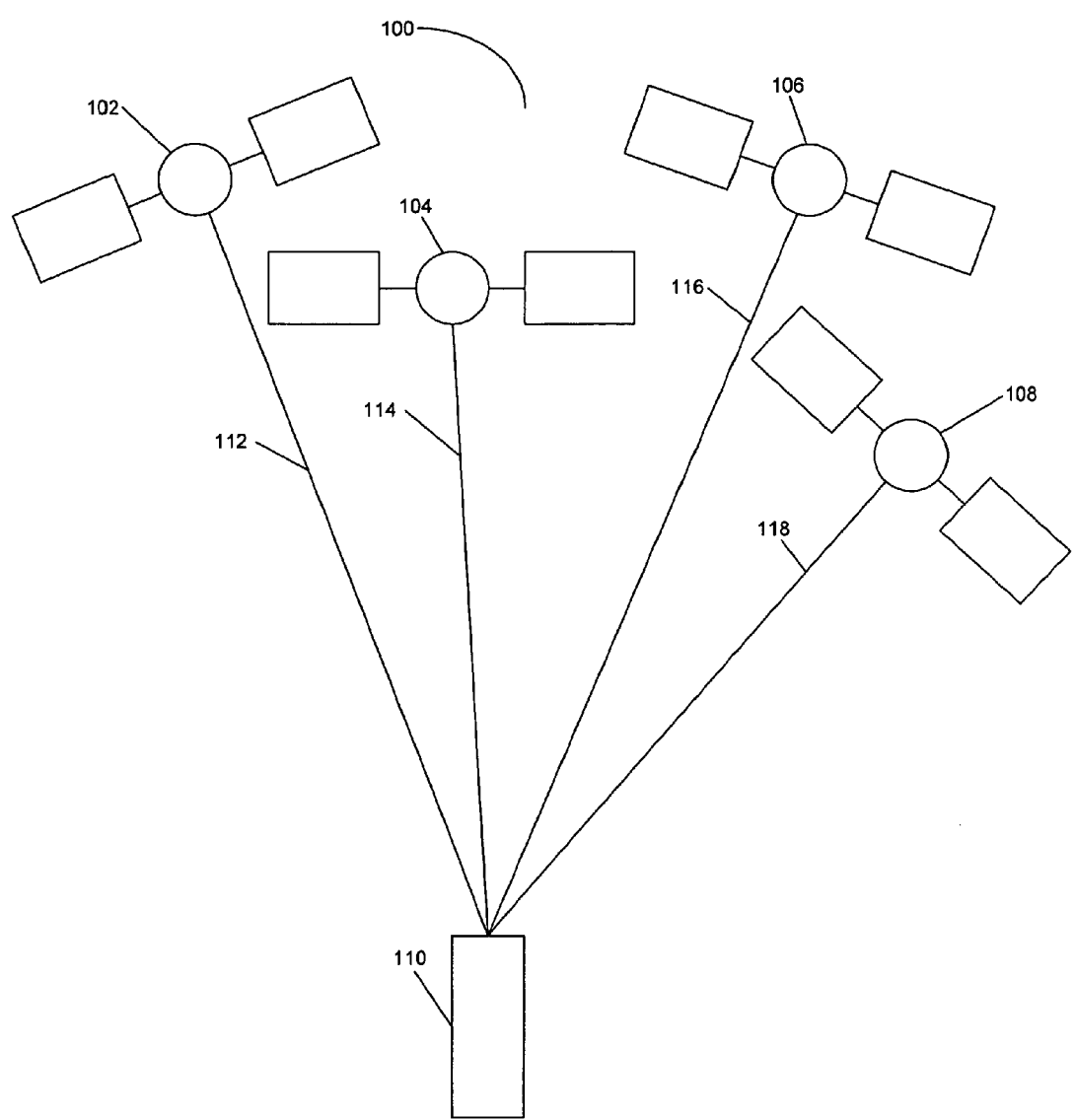
FIG. 1 illustrates a typical Satellite Positioning System in accordance with the present invention.

FIG. 1 illustrates a typical Satellite Positioning System in accordance with the present invention.

System 100 illustrates a constellation of satellites 102-108 and a receiver 110. Each of the satellites 102-108 transmits a signal 112-118 respectively, which signals 112-118 are received by receiver 110.

Signals 112-118 contain information such as time of transmission and system time for system 100. Receiver 110 uses the time it takes for signals 112-118 to travel the distances between the satellites 102-108 and receiver 110 and the data within signals 112-118 to determine the latitude, longitude, and altitude coordinates (geoposition) of receiver 110. This generic ranging system is typically known as the Global Positioning System (GPS), which is described in the related art.

The frequencies of interest in a GPS system 100 are in the "L-band" of frequencies, typically around 1575 MHz, but other positioning systems with other frequencies of interest can also benefit from the present invention.

Frequency Allocation

The frequency usage allocation in different countries and areas are different, and, therefore, in a transceiver (including receiver and transmitter here) designs, e.g., for receiver 110, a fixed frequency plan (LO, IF and Baseband frequencies) may not yield equally good performance in all of the diverse geographic markets and areas.

However, for receivers 110, the geographic information can be obtained by the receiver 110, and thus, it is possible to switch frequency plans to the one that better suits conditions in the geographic area that the receiver 110 is being used.

For GPS receiver or cell phone related products, the detection of geographic location is trivial since such information can be easily obtained from GPS signals and cell phone carrier information. To extend the application of this invention, it is possible that the user input the location information for those systems that location information cannot be obtained automatically.

Figure 2:
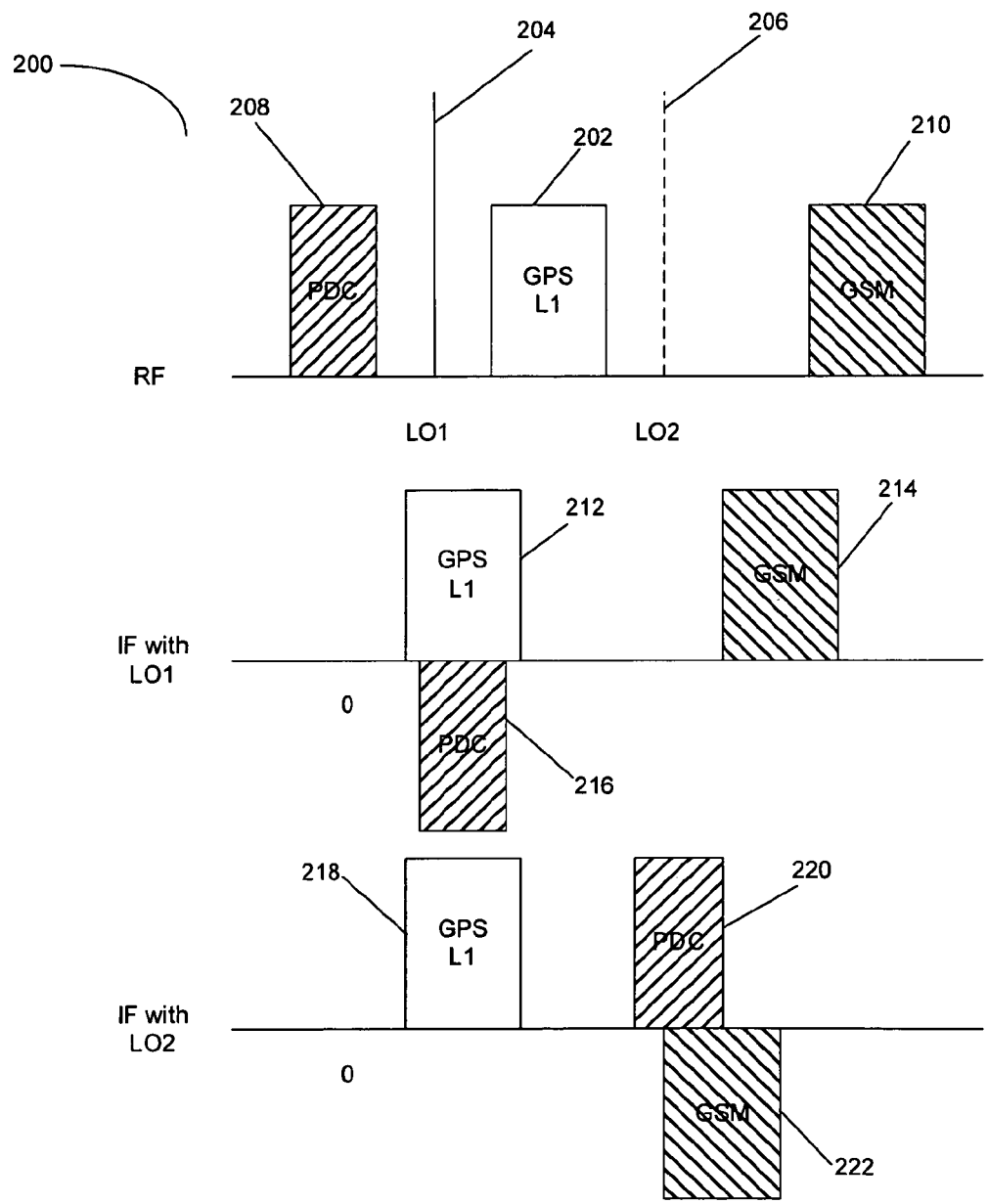
FIG. 2 illustrates the RF and IF frequency plans for a GPS receiver in accordance with the present invention.

FIG. 2 illustrates the RF and IF frequency plans for a GPS receiver in accordance with the present invention.

Frequency usage 200 is illustrated, with GPS frequencies 202, Local Oscillator (LO) frequency for LO1 204, LO frequency for LO2 206, PDC frequencies 208, and GSM frequencies 210 shown. At the transmission frequency band, the GPS frequencies 202 fall between the GSM frequencies 210 and the PDC frequencies 208.

However, when the RF frequencies 202, 208, and 210 are downconverted using LO1 204, GPS Intermediate Frequencies (IF) 212 fall within the same frequency band as PDC IF frequencies 216. This makes it more difficult for receiver 110 to process GPS signals 202, because there is local interference from the PDC signals 216.

In the GPS receiver 110 as an example, GPS L1 frequencies 202 occupy the band centered at 1575.42 MHz. Major interferers with this frequency band 202 are GSM cellular telephone users. For a super-heterodyne GPS receiver, the LO frequency 204 should be selected lower than frequency band 202 to maximize the distance (frequency-wise) between the 1710 MHz GSM signals 210 and GPS signals 202.

However, in Japan, there is a frequency band 208 used for the Japanese cellular system, known as the PDC band 208, that occupies frequencies up to 1501 MHz. The PDC IF band 216 can be very close or right inside of the image band of GPS IF signals 212 when the LO frequency 204 is lower than GPS band 206 and the GPS IF signals 212 are low.

A conventional design typically changes the GPS IF signal band 212 for all cases to a much higher frequency, which will increase power consumption and make an IF filter more difficult to design, or change the IF band 212 to a lower or close to DC frequency, which requires image-reject down-conversion and cause problems in DC offset cancellation. Either way will increase power consumption, complexity and degrade performance.

However, the present invention adapts the GPS IF bands 212 and 218 depending on whether or not the receiver 110 is in Japan, or, in other cases, when there are other interfering signals present nearby the GPS IF signals 212 and/or 218.

As such, when PDC signals 208 are present, the receiver 110 of the present invention has the ability to use a different Local Oscillator frequency, namely, LO2 208, to downconvert the GPS signals 202 into a different frequency band, namely, GPS IF band 218, and, similarly, PDC signals will be downconverted into frequency band 220 and GSM frequencies will be downconverted into frequency band 222.

This adaptable nature of the present invention is operable in GPS-enabled devices because PDC signals 208 and GSM signals 210 do not co-exist in any geographic areas, but the receiver 110 can travel to markets where either PDC signals 208 or GSM signals 210 exist. Receiver 110 can have a predetermined local oscillator frequency to use, and, if certain situations or conditions exist, the local oscillator can switch from one to another. For example, and not by way of limitation, the receiver 110 can be set to use LO1 204 as a standard operating mode, and, if PDC signals 208 are present, or receiver 110 determines that receiver 110 is in an area where PDC signals 208 may be present, then receiver 110 uses local oscillator frequency LO2 206 instead of LO1 frequency 204.

PDC signals 208 are typically present only in Japan, and, therefore, receiver 110 can use several pieces of data to determine whether to switch from one local oscillator frequency to another. Receiver 110 can determine a position, and, if that position determination shows that receiver 110 is in Japan, a command can be sent to switch to LO2 frequency 206. Alternatively, a sensor can be used to determine if PDC signals 208 are present, and the switch to LO2 frequency 206 can be made at that time. Further, the receiver 110 may be part of a GPS-enabled device that can sense Internet Protocol (IP) addresses. Since the location of IP addresses can be determined by a reverse DNS lookup and the "Whois" database, or via commercially available software, receiver 110 can use that data to determine whether or not receiver 110 is in Japan and therefore needs to switch to LO2 frequency 206.

Similarly, GSM signals 210 are not present in Japan. So, a sensor can be used to determine the presence or absence of GSM signals 210, and the local oscillator frequency can be selected based on the presence or absence of GSM signals 210.

A GPS receiver 110 in accordance with the present invention can also determine when to switch the local oscillator frequency based on the GPS signal quality. If the GPS signal quality is poor, it may be because there is a PDC and/or GSM and/or other signal interfering with the GPS signal, either in the RF band or the IF band. The local oscillator frequency can then be switched to determine if the GPS signal quality can be improved, either by avoiding the PDC/GSM/Other signal interference, or, perhaps, by allowing the GPS receiver to downconvert a signal from a different GPS band, say the L2 or L5 band.

Figure 3:
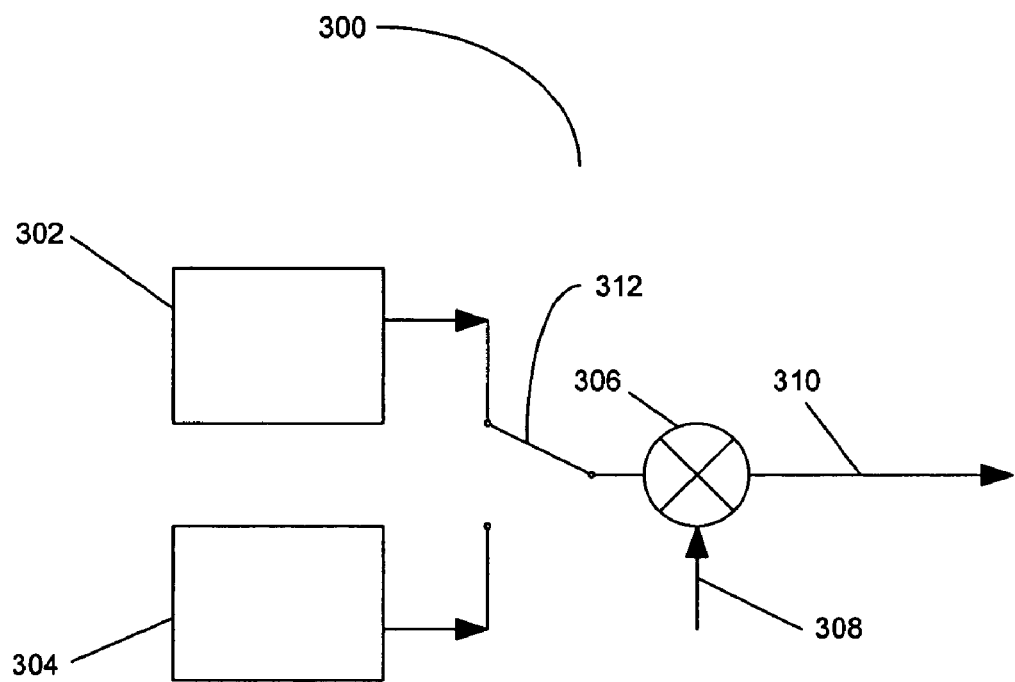
FIG. 3 illustrates a block diagram of a frequency generator in accordance with one or more embodiments of the present invention.

FIG. 3 illustrates a block diagram of a frequency generator in accordance with one or more embodiments of the present invention.

System 300 shows a first local oscillator 302, a second local oscillator 304, a mixer 306, an incoming signal 308, and output 310. Switch 312 is switched when the system 300 determines that an interfering signal, such as PDC signal 208, is present, or when receiver 110 determines that the position of receiver 110 would have interfering signals present, and therefore, receiver 110 may use the second local oscillator 304 rather than the first local oscillator 302.

Figure 4:
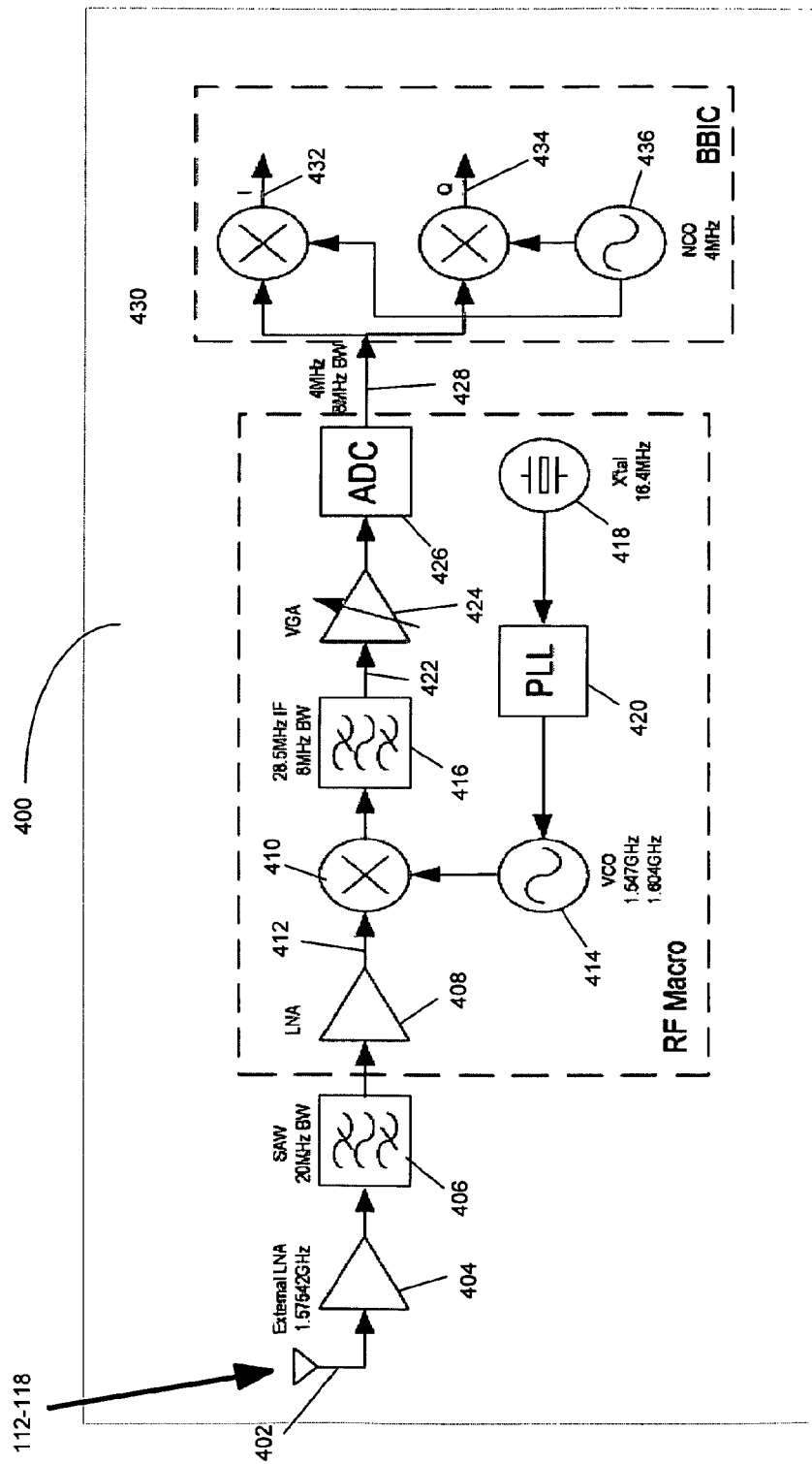
FIG. 4 illustrates a typical GPS receiver architecture in accordance with one or more embodiments of the present invention.

FIG. 4 illustrates a typical GPS receiver architecture in accordance with one or more embodiments of the present invention.

Receiver 400 is shown receiving signals 112-118 from GPS satellites at antenna 402. Amplifier 404 amplifies these signals at their transmitted frequencies, typically 1.57542 GHz, and passes these signals to bandpass filter 406. Bandpass filter 406 performs an image rejection function to filter out signals that are undesirable in receiver 400.

The filtered signals are then again amplified using amplifier 408, which is typically a low-noise amplifier, and are then mixed at mixer 410 to produce sum and difference signals of the signal 412 with the output frequency of Voltage Controlled Oscillator (VCO) 414. The output of mixer 410 is again bandpass filtered at filter 416, to remove the summed signal of signal 412 and the VCO 414 output. The combination of filter 406 and filter 416, in addition to downconverting the satellite signals 112-118 to an intermediate frequency with reduced noise by-products, also filters out cellular telephone signals that may interfere with the reception and decoding of satellite signals 112-118.

The selection of the VCO 414 frequency is set by crystal 418 and a Phase-Locked-Loop (PLL) 420, which provide a variable voltage input to the VCO 414, thereby changing the frequency output of VCO 414. This changes one of the inputs to mixer 410, and changes the sum and difference products when mixed with signals 412, to generate a signal out of mixer 410 with different frequencies.

Signals 422 are at an Intermediate Frequency (IF), as they are typically at a frequency, which is the difference between the transmitted frequency of signals 112-118 and the frequency of VCO 414. It is at this IF where processing problems occur, because the IF signal 422 is close to the frequency of other signals, e.g., the frequency of crystal 418, the frequency of cellular transmission frequencies, and the harmonics of such frequencies. As such, the selection of the IF signal 422 is somewhat important because if the bandwidth of the IF signal 422 coincides with an interfering frequency, the processing of IF signal 422 may be difficult to perform and/or result in errors during the processing of IF signal 422.

Signals 422 are then passed to a variable gain amplifier 424 and an Analog-to-Digital Converter (ADC) 426, to generate a signal 428 that is passed to baseband circuitry 430 to generate the In-phase (I) and Quadrature-phase (Q) signals 432 and 434, respectively, through mixing signal 428 with a Numerically Controlled Oscillator (NCO) 436. Although shown as receiver 400, other types of receivers, with other circuitry and signal processing techniques, are compatible with and within the scope of the present invention.

Figure 5:
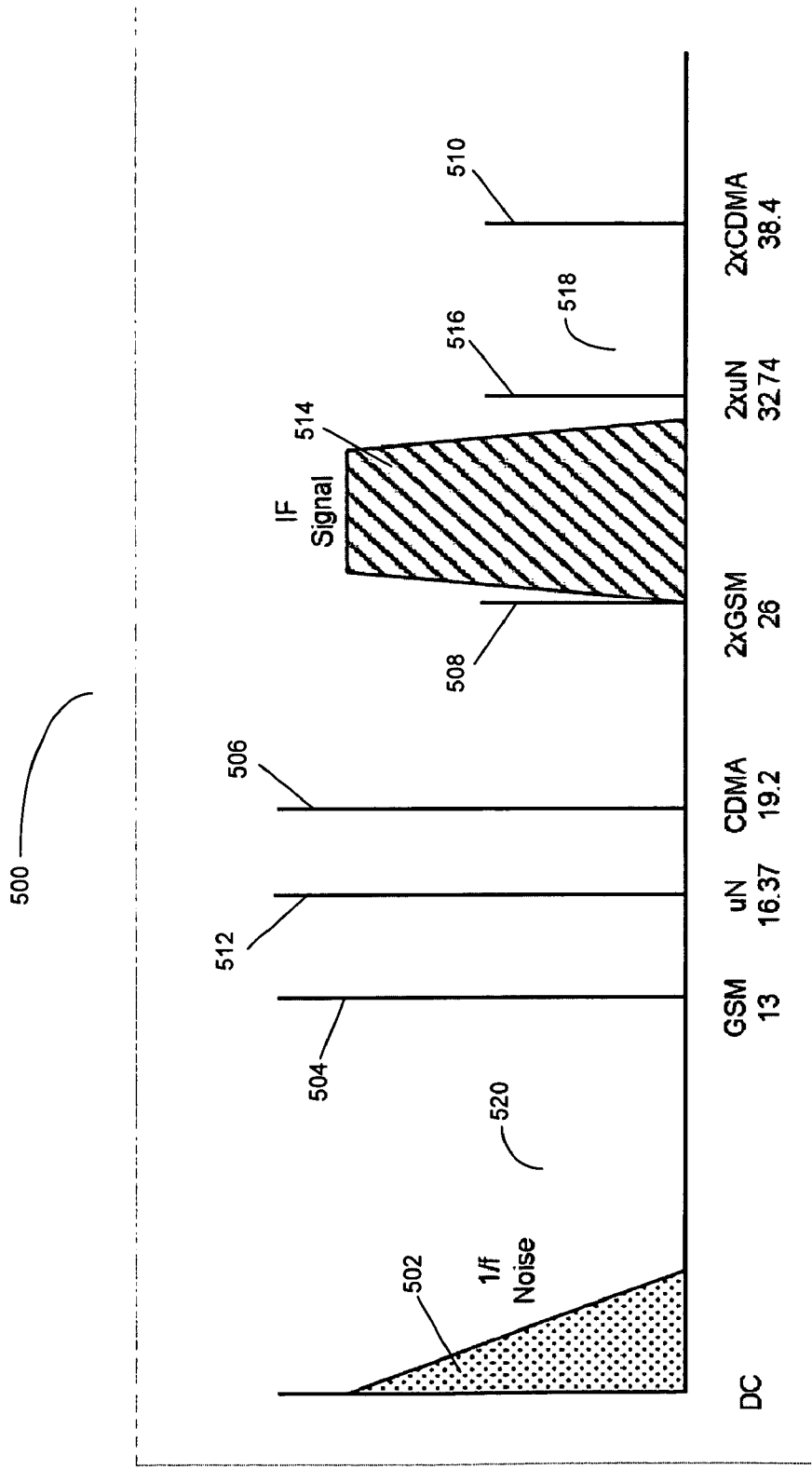
FIG. 5 illustrates the frequency spectrum with various generated and potential interfering signals as related to one or more embodiments of the present invention.

FIG. 5 illustrates the frequency spectrum with various generated and potential interfering signals as related to one or more embodiments of the present invention.

Spectrum 500 is shown, with various signals that appear in the vicinity of IF frequencies typically used in spread spectrum receivers. There is a 1/f noise component 502, that falls off dramatically as the frequency increases. The Global System for Mobile communications (GSM, from Groupe Spécial Mobile) system uses a standard reference signal frequency of 13 MHz, shown as frequency 504. Code Division Multiple Access (CDMA) systems typically use a temperature compensated crystal oscillator (TCXO) frequency 506 (at 19.2 MHz) as a reference frequency for CDMA system handsets. The first harmonic (twice the frequency) of GSM signal 504 is at 26 MHz, shown as signal 508, and the first harmonic of the CDMA signal 506 is at 38.4 MHz, shown as signal 510.

Selecting a reference frequency for crystal 418, which controls the IF frequency of IF signal 422 (and therefore spectrum 514), becomes important because the reference frequency for crystal 418, the harmonics from crystal 418, and the resultant IF frequency spectrum, should avoid interference with signals 502-510, and avoid interference with each other, to allow the IF signal 422 to be processed with as few errors and with as little additional signal manipulation as possible. For example, and not by way of limitation, if the IF signal 422 was co-located with signal 504, in GSM telephones where a receiver 110 or 400 is present, the potential interference from the GSM reference frequency 504 may make it difficult to process signals 112-118, or, worse, may introduce errors into the processing of signals 112-118, such that any geoposition determined by receiver 110 or 400 may be incorrect.

An example frequency generated by crystal 418 for use with one or more embodiments of the present invention is 16.37 MHz, shown as signal 512, which generates an IF frequency of signal 422 shown as spectrum 514 in FIG. 5. Spectrum 514 also avoids the first harmonic of signal 512, namely signal 516, which is at 32.74 MHz. Other portions of the spectrum 500 can also be used within the scope of the present invention, e.g., section 518, between signals 506 and 508, and section 520, between signal 502 and signal 504, so long as the crystal 418 frequency and harmonics of the crystal 418 frequency are avoided by spectrum 514.

Implementation

Figure 6:
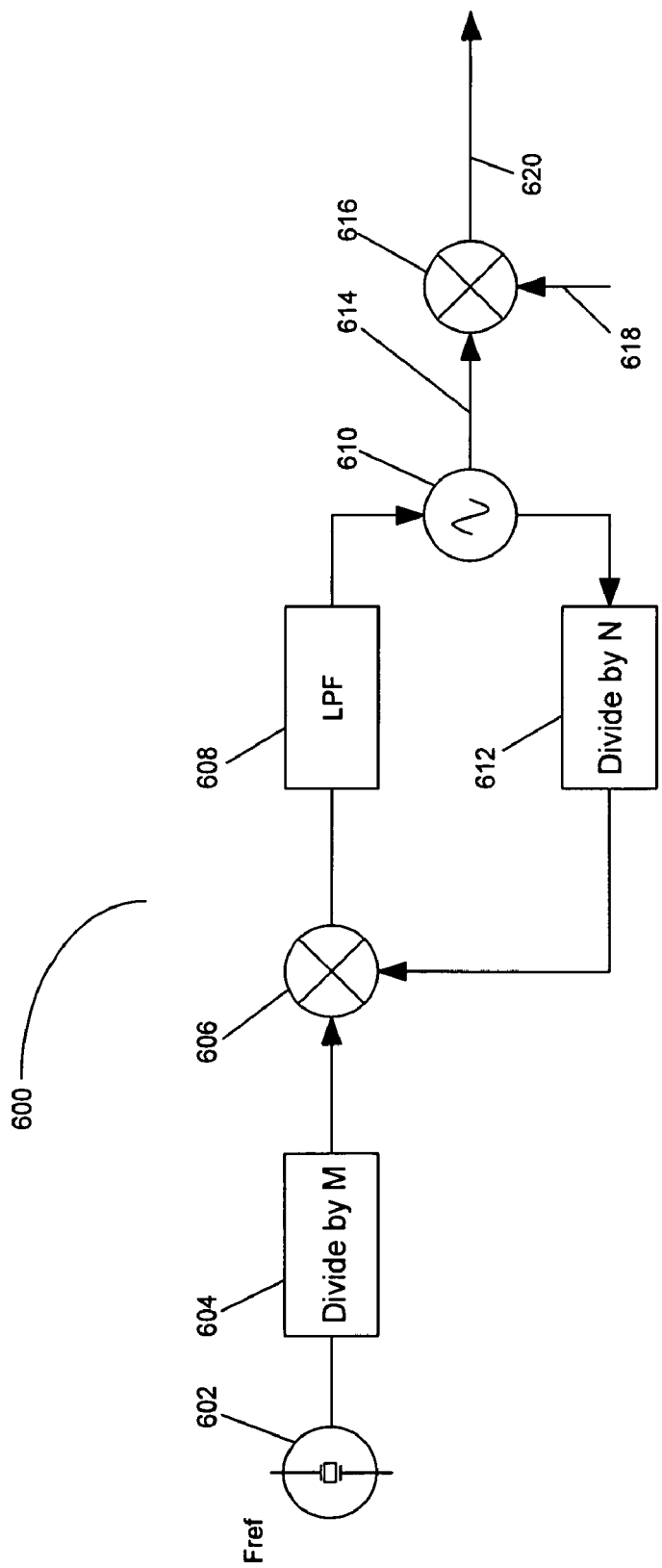
FIG. 6 illustrates a typical implementation of the block diagram of FIG. 3.

FIG. 6 illustrates a typical implementation of the block diagram of FIG. 3.

Although two separate local oscillators 302 and 304 can be used, such an implementation is typically not very cost effective, and generates interference because of the interaction between first local oscillator 302 and second local oscillator 304 within the same receiver 110. As such, system 600 is a more typical approach to implementation of the present invention.

System 600 comprises a reference frequency 602, which is typically generated by a crystal, that is input to a divider circuit 604. The frequency that is output from reference frequency 602 is Fref. Divider circuit 604 is a "divide by M" circuit, such that the frequency that is output from divider circuit 604 is Fref/M. The output of divider circuit 604 is input to mixer 606.

The output of mixer 606 is input to a low pass filter 608, which generates a control voltage that controls the output of a Voltage Controlled Oscillator (VCO) 610. The output of VCO 610 is input to another divider circuit 612, that is also fed into mixer 606. Divider circuit 612 is a "divide by N" circuit, which divides the output of the VCO 610 by N.

When the circuit 600 is in operation, output 614 is the output of the VCO 610, and is equal to N/M Fref. This output 614 is mixed at mixer 616 with the GPS RF signal 618 to generate the GPS IF signal 620.

Divide circuits 604 and 612 are typically implemented as counter circuits. By changing the counter values, the M and N divide values can be changed. For example, to change the output of the VCO 610, the counter value for divide circuit can be changed from N1 to N2, which would change the frequency of the VCO output 614 from N1/M Fref to N2/M Fref. Additional values of N can be used to have several different frequency outputs at VCO output 614 if desired. Further, control of the VCO output 614 can be changed by changing the M values for divider circuit 604 if desired, or the frequency output can be changed by changing both M and N values if desired.

So, if the two LO frequencies 204 and 206 are known, it is straightforward to determine the N and M values needed for a given Fref 602 to generate different IF outputs 620 for circuit 600.

Again, default values of N and/or M for divider circuits 604 and 612 can be set, and these values changed when a certain condition occurs or a certain state of the receiver 110 is entered. For example, and not by way of limitation, receiver 110 can determine a position, or receiver 110 can determine that a specific signal is present, such as the PDC signal. Once receiver 110 has data to indicate that receiver 110 is in Japan, receiver 110 changes the counter values for N and/or M to generate a new VCO output 614, and the IF output 620 will change to avoid interference with the PDC signal.

Manual override of any switching of the VCO output 614, or manual determination of the VCO output 614, is also possible within the scope of the present invention. For example, and not by way of limitation, if the PDC signal 208 is so strong that the receiver 110 cannot determine position, a user can manually override the VCO output 614 determination to force the system 600 to switch to the different N and/or M values to avoid the PDC signal 208 interference.

Figure 7:
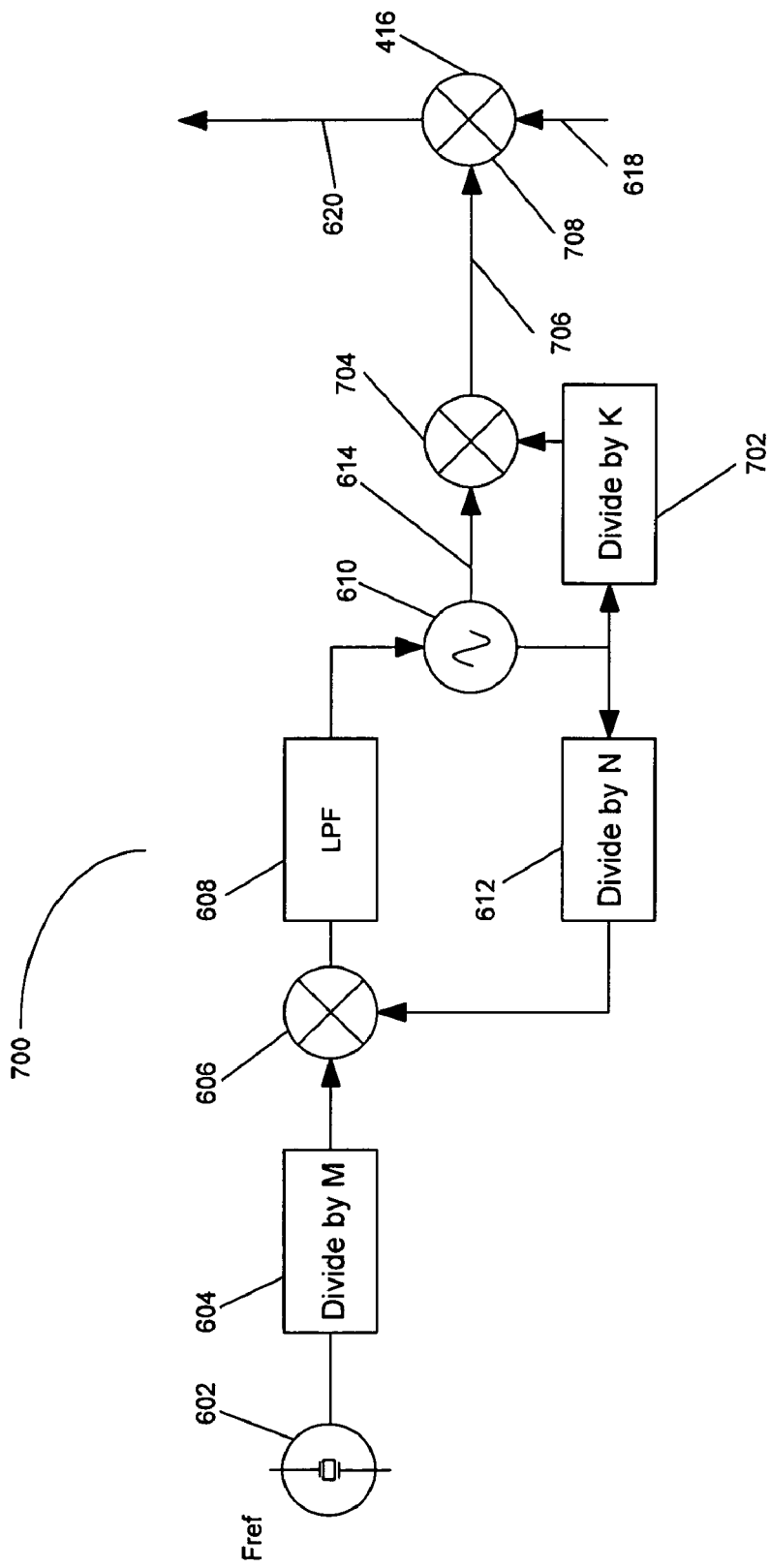
FIG. 7 illustrates an alternative embodiment of the present invention.

FIG. 7 illustrates an alternative embodiment of the present invention.

Circuit 700 is similar to circuit 400, but an additional divide circuit 702, a "Divide by K" circuit is connected to an additional mixer 704. By changing the values of K in the divide circuit 702, the output frequency 706 of the circuit 700 changes. So, the VCO output 614 enters mixer 704, and is also sent to divide circuit 612 and divide circuit 702. A phase-locked loop is formed with divide circuit 612 and VCO 610, and a second frequency is generated by mixing VCO 610 with divide circuit 702. The frequency at output 706 is then determined by the frequency of the VCO 610 and the sum/difference of the VCO 610 frequency combined with the divide circuit 702.

This may be a preferred implementation to switch between different GPS frequencies 418, e.g., the "L1" band and the "L2" band and/or the "L5" band, as well as to select the proper IF output 620 for GSM/PDC interferences via the mixer 708.

Figure 8:
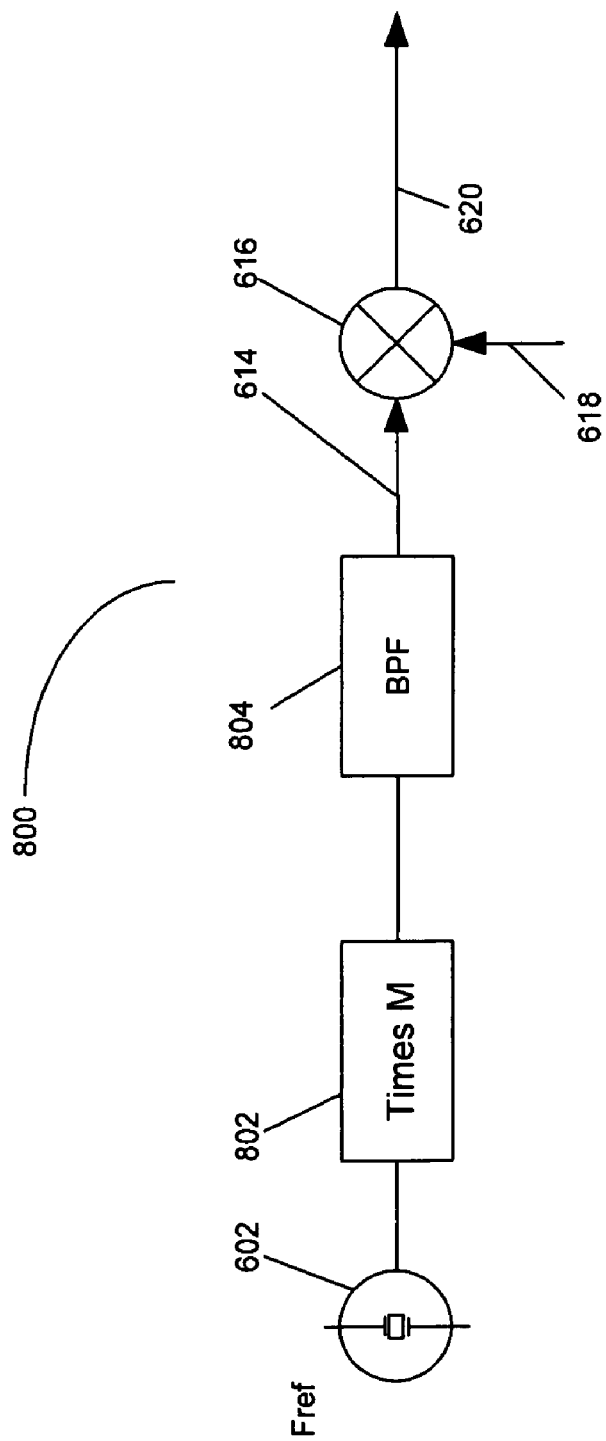
FIG. 8 illustrates another alternative embodiment of the present invention.

FIG. 8 illustrates another alternative embodiment of the present invention.

Circuit 800 shows a "times M" circuit 802 that is output to a bandpass filter 804. By programming the bandpass filter 804, different frequencies can be generated at output 614, and mixed at mixer 616 with GPS signal 618 to generate different IF outputs 620. Several different methods can be used to generate the times M outputs, e.g., an Impact ionization Avalanche Transit-Time (IMPATT) diode, a frequency multiplier, a varactor, or other circuit devices, without departing from the scope of the present invention.

Typical Frequency Spectrum Usage

Figure 9:
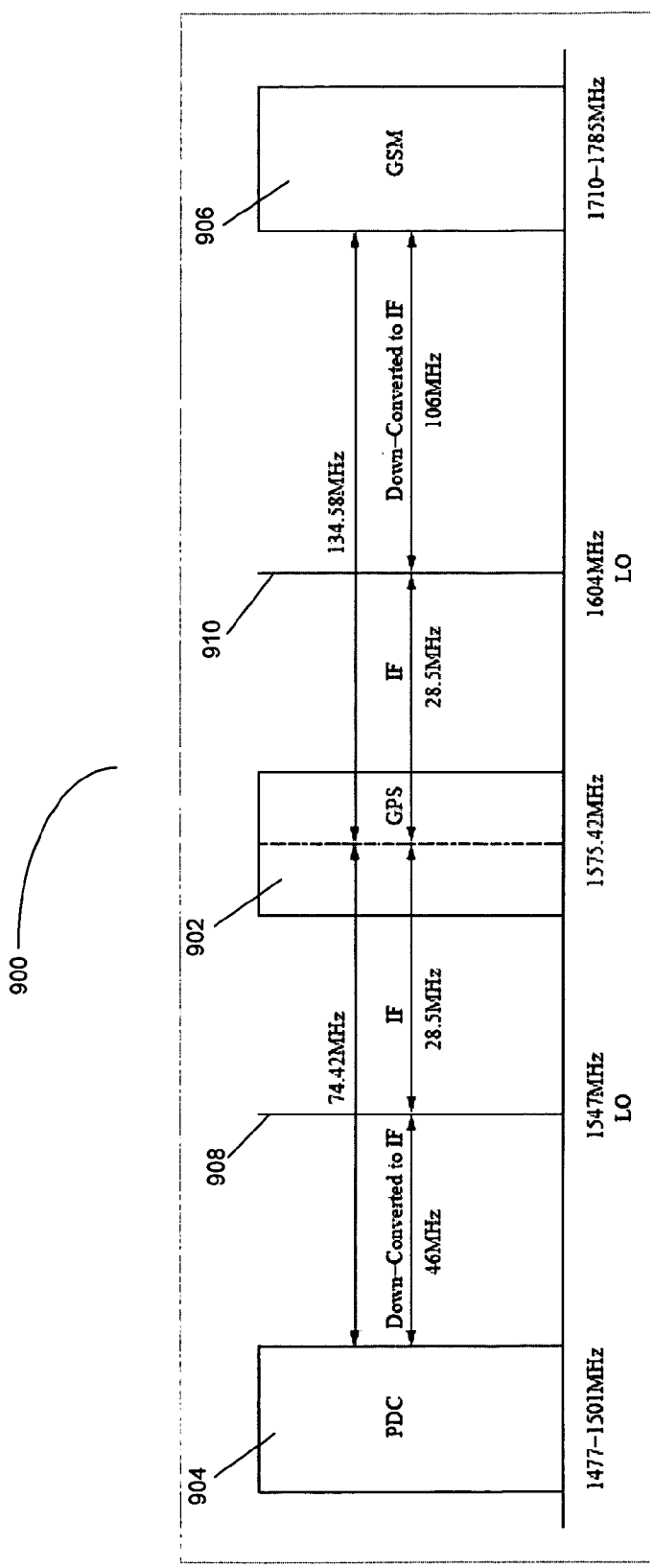
FIG. 9 illustrates a frequency spectrum usage in accordance with one or more embodiments of the present invention.

FIG. 9 illustrates a frequency spectrum usage in accordance with one or more embodiments of the present invention.

Spectrum 900 shows the GPS spectrum usage 902, and two standard telephone frequency spectra uses, the GSM spectrum 904 and the PDC spectrum 906. Typically, the GPS spectrum 902 is centered at 1574.42 MHz, the GSM spectrum 904 covers 1710-1785 MHz, and the PDC spectrum 906 covers 1477-1501 MHz.

By selecting a local oscillator frequency of either 1547 MHz, at frequency 908, or 1604 MHz, at frequency 910, the interference between the downconverted spectra 904 and 906 and the downconverted GPS spectrum 902 can be minimized. For example, in Japan, where the PDC spectrum 906 is present, the interference will come at frequencies below the GPS spectrum 902, and the use of a higher frequency 910 for the local oscillator may be desirable to eliminate this possible interference.

Other local oscillator frequencies 908 and 910 can be used within the scope of the present invention to avoid other spectra that may be present in local or regional areas.

Process Chart

Figure 10:
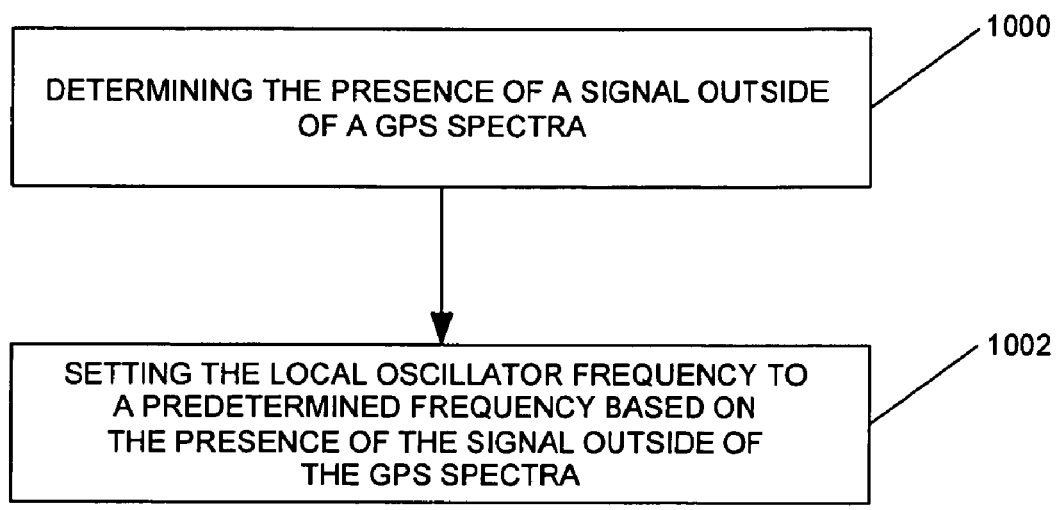
FIG. 10 illustrates a flowchart illustrating the steps used to perform the present invention.

FIG. 10 illustrates a flowchart illustrating the steps used to perform the present invention.

Block 1000 illustrates determining the presence of a signal outside of a GPS spectra.

Block 1002 illustrates setting the local oscillator frequency to a predetermined frequency based on the presence of the signal outside of the GPS spectra.

So, for example, and not by way of limitation, the GPS receiver 110 can determine if the PDC signal or the GSM signal is present and set the local oscillator frequency accordingly; or, if desired, can always look for one of the signals, e.g., the PDC signal, and if the PDC signal is present, set the local oscillator frequency to a first frequency, and if the PDC signal is not found, set the local oscillator frequency to a second frequency, such that interference is reduced.

CONCLUSION

In summary, the present invention describes a selectable frequency source for use in GPS receivers. A device in accordance with one or more embodiments of the present invention comprises at least one reference frequency source, a circuit, coupled to the at least one reference frequency source, and a mixer, coupled to an output of the circuit, for mixing a GPS signal with the output of the circuit, wherein a frequency output of the mixer is changed based on an input to the circuit.

Such a device further optionally comprises the circuit being coupled to a single reference frequency source, the frequency output of the circuit being changed when the GPS receiver determines that the GPS receiver is in a predetermined geographic region, the predetermined geographic region being determined by a presence of an interfering signal, the interfering signal being a PDC signal, and the frequency output of the circuit being manually changed.

A selectable frequency source for use in a Global Positioning System (GPS) receiver in accordance with one or more embodiments of the present invention comprises a reference frequency source generating a reference frequency, a circuit, coupled to the reference frequency source, the circuit having an output frequency based on the reference frequency, and a mixer, coupled to the circuit, for mixing a GPS signal with the output frequency of the circuit, wherein the output frequency of the circuit is changed to change a frequency output of the mixer.

Such a device further optionally the output frequency being changed by changing an input signal to the circuit, the output frequency being changed when the GPS receiver determines that the GPS receiver is in a predetermined geographic region, the predetermined geographic region being determined by a presence of an interfering signal, and the interfering signal being a PDC signal.

A method in accordance with one or more embodiments of the present invention changes a local oscillator frequency in a Global Positioning System (GPS) receiver, and comprises determining the presence of a signal outside of a GPS spectra, and setting the local oscillator frequency to a predetermined frequency based on the presence of the signal outside of the GPS spectra.

Such a method further optionally comprises the signal outside of the GPS spectra being a PDC signal, and/or the signal outside of the GPS spectra being a GSM signal.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims and the equivalents of the claims which form a part of this application.

What is claimed is:

1. A selectable frequency source for use in a Global Positioning System (GPS) receiver, comprising
    at least one reference frequency source;
    a circuit, coupled to the at least one reference frequency source; and
    a mixer, coupled to an output of the circuit, for mixing a GPS signal with the output of the circuit,
wherein a frequency output of the mixer is changed based on an input to the circuit and wherein the input depends upon expected interference conditions.

2. The selectable frequency source of claim 1, wherein the circuit is coupled to a single reference frequency source.

3. The selectable frequency source of claim 2, wherein the frequency output of the circuit is changed when the GPS receiver determines that the GPS receiver is in a predetermined geographic region.

4. The selectable frequency source of claim 3, wherein the predetermined geographic region is determined by a presence of an interfering signal.

5. The selectable frequency source of claim 4, wherein the interfering signal is a PDC signal.

6. The selectable frequency source of claim 3, wherein the frequency output of the circuit is manually changed.

7. A selectable frequency source for use in a Global Positioning System (GPS) receiver, comprising:
    a reference frequency source generating a reference frequency;
    a circuit, coupled to the reference frequency source, the circuit having an output frequency based on the reference frequency; and
    a mixer, coupled to the circuit, for mixing a GPS signal with the output frequency of the circuit,
wherein the output frequency of the circuit is changed based upon expected interference conditions to change a frequency output of the mixer.

8. The selectable frequency source of claim 7, wherein the output frequency is changed by changing an input signal to the circuit.

9. The selectable frequency source of claim 7, wherein the output frequency is changed when the GPS receiver determines that the GPS receiver is in a predetermined geographic region.

10. The selectable frequency source of claim 7, wherein the predetermined geographic region is determined by a presence of an interfering signal.

11. The selectable frequency source of claim 10, wherein the interfering signal is a PDC signal.

12. A method for changing a local oscillator frequency in a Global Positioning System (GPS) receiver, comprising:
    determining the presence of a signal outside of a GPS spectra; and
    setting the local oscillator frequency to a predetermined frequency based on the presence of the signal outside of the GPS spectra.

13. The method of claim 12, wherein the signal outside of the GPS spectra is a PDC signal.

14. The method of claim 12, wherein the signal outside of the GPS spectra is a GSM signal.

* * * * *